United States Patent
Akram et al.

(10) Patent No.: US 10,942,235 B2
(45) Date of Patent: Mar. 9, 2021

(54) MICROSTRIP TRANSMISSION LINE ARRAY RF COIL, RF SHIELD CONFIGURATION AND INTEGRATED APPARATUS OF RF COIL AND RADIATION IMAGING DEVICE

(71) Applicant: NATIONAL INSTITUTES FOR QUANTUM AND RADIOLOGICAL SCIENCE AND TECHNOLOGY, Chiba (JP)

(72) Inventors: Md Shahadat Hossain Akram, Chiba (JP); Takayuki Obata, Chiba (JP); Taiga Yamaya, Chiba (JP)

(73) Assignee: NATIONAL INSTITUTES FOR QUANTUM AND RADIOLOGICAL SCIENCE AND TECHNOLOGY, Chiba (JP)

( * ) Notice: Subject to any disclaimer, the term of this patent is extended or adjusted under 35 U.S.C. 154(b) by 42 days.

(21) Appl. No.: 16/368,545

(22) Filed: Mar. 28, 2019

(65) Prior Publication Data
US 2019/0302206 A1 Oct. 3, 2019

Related U.S. Application Data

(60) Provisional application No. 62/649,129, filed on Mar. 28, 2018.

(30) Foreign Application Priority Data

Feb. 28, 2019 (JP) .............................. JP2019-036114

(51) Int. Cl.
*G01R 33/422* (2006.01)
*G01R 33/48* (2006.01)
(Continued)

(52) U.S. Cl.
CPC ..... *G01R 33/422* (2013.01); *G01R 33/34076* (2013.01); *G01R 33/3657* (2013.01); *G01R 33/481* (2013.01); *H01P 3/081* (2013.01)

(58) Field of Classification Search
CPC .......................... G01R 33/422; G01R 33/481; G01R 33/3657; G01R 33/34076; G01R 33/365;
(Continued)

(56) References Cited

U.S. PATENT DOCUMENTS 5,523,689 A * 6/1996 Oppelt ............. G01R 33/34046
324/318
2003/0206017 A1* 11/2003 Boskamp ............. G01R 33/385
324/318
(Continued)

FOREIGN PATENT DOCUMENTS

JP 2006-280929 A 10/2006
JP 2012-152551 A 8/2012

OTHER PUBLICATIONS

Seo, Design of Microstrip-Based Surface Coils for Low-Field Small-Bore MR Applications, Concepts in Magnetic Resonance Part B (Magnetic Resonance Engineering), vol. 41B(4) 111-119. (Year: 2012).*
(Continued)

*Primary Examiner* — Susan S Lee
(74) *Attorney, Agent, or Firm* — Oliff PLC

(57) ABSTRACT

PET or SPECT insert for MRI or MRS system with medium (3 T for example) to ultra high (7 T for example) magnetic field is provided. RF shielded radiation detector modules are separately disposed in a form of full or partial ring shape. The RF shielded radiation detector modules are electric ground conductors for microstrip transmission line coil RF
(Continued)

array. Decoupling circuits in between grounded shield and/or in between microstrip conductors make electric isolation between coil elements.

15 Claims, 12 Drawing Sheets

(51) Int. Cl.
  *H01P 3/08* (2006.01)
  *G01R 33/36* (2006.01)
  *G01R 33/34* (2006.01)
(58) Field of Classification Search
  CPC ............ G01R 33/3415; G01R 33/5659; G01R 33/3456; H01P 3/081
  See application file for complete search history.

(56) References Cited

U.S. PATENT DOCUMENTS

| | | | |
|---|---|---|---|
| 2006/0250133 | A1 | 11/2006 | Krieg et al. |
| 2009/0251145 | A1* | 10/2009 | Kaneko ............ G01R 33/34076 324/318 |
| 2010/0219347 | A1* | 9/2010 | Schulz .................. G01T 1/1603 250/363.04 |
| 2013/0296689 | A1 | 11/2013 | Okamoto et al. |
| 2016/0084926 | A1* | 3/2016 | Kim ................. G01R 33/34046 324/322 |
| 2017/0299675 | A1* | 10/2017 | Rigla Perez .......... G01T 1/1642 |
| 2018/0074144 | A1* | 3/2018 | Dezorayev ............ G01T 1/1603 |
| 2018/0275227 | A1* | 9/2018 | Song .................. G01R 33/3415 |
| 2019/0239747 | A1* | 8/2019 | Fang .................... A61B 6/4411 |

OTHER PUBLICATIONS

H.P. Schlemmer, et al.; "Simultaneous MR/PET imaging of the human brain: feasibility study"; Radiology; vol. 248; No. 3; Sep. 2008; pp. 1028-1035.
F. Nishikido et al.; "Feasibility of a brain-dedicated PET-MRI system using four-layer DOI detectors integrated with an RF head coil; Nuclear Instruments and Methods in Physics Research A"; vol. 756; 2014; pp. 6-13.
P. Olcott et al.; "Prototype positron emission tomography insert with electro-optical signal transmission for simultaneous operation with MRI"; Physics in Medicine and Biology; vol. 60; 2015; pp. 3459-3478.
K. Hong et al.; "A prototype MR insertable brain PET using tileable GAPD arrays"; Med. Phys.; vol. 40; Apr. 2013; pp. 1-11.
A.J. Gonza?lez, et al.; "The MINDView brain PET detector, feasibility study based on SiPM arrays"; Nuclear Instruments and Methods in Physics Research A; vol. 818; 2016; pp. 82-90.
C.M. Collins and Z. Wang; "Calculation of Radiofrequency Electromagnetic Fields and Their Effects in MRI of Human Subjects"; Magnetic Resonance in Medicine; vol. 65; 2011; pp. 1470-1482.
X. Zhang, et al.; "Microstrip RF Surface Coil Design for Extremely High-Field MRI and Spectroscopy"; Magnetic Resonance in Medicine; vol. 46; 2001; pp. 443-450.
R.F. Lee, et al.; "Lumped-Element Planar Strip Array (LPSA) for Parallel MRI"; Magnetic Resonance in Medicine; vol. 51; 2004; pp. 172-183.
J.T. Vaughan, et al.; "Whole-Body Imaging at 7T: Preliminary Results"; Magnetic Resonance in Medicine; vol. 61; 2009; pp. 244-248.
K.L. Moody, et al; "An eight-channel T/R head coil for parallel transmit MRI at 3T using ultra-low output impedance amplifiers"; Journal of Magnetic Resonance; vol. 246; 2014; pp. 62-68.
A.L. Brownell, et al.; "Combined PET/MRS brain studies show dynamic and long-term physiological changes in a primate model of Parkinson disease"; Nature Medicine; vol. 4; No. 11; Nov. 1998; pp. 1308-1312.
V. Panebianco, et al.; "High-field PET/MRI and MRS: potential clinical and research applications"; Clin Transl Imaging; 2013; pp. 1:17-29.
G. Shajan, et al.; "Three-layered radio frequency coil arrangement for sodium MRI of the human brain at 9.4 Tesla"; Magnetic Resonance in Medicine; vol. 75; 2016; pp. 906-916.
G. Adriany, et al.; "A 32-Channel Lattice Transmission Line Array for Parallel Transmit and Receive MRI at 7 Tesla"; Magnetic Resonance in Medicine; vol. 63; 2010; pp. 1478-1485.
Zhang X, Chen YE, Lim R et al. Synergistic role of simultaneous PET/MRI-MRS in soft tissue sarcoma metabolism Imaging. Magn Reson Imag 2016; 34:276-279.

* cited by examiner (a)

(b)

(a)

(b)

(c)

Shield not shown (a)

(b)

(a)

(b)

(a)

(b)

MICROSTRIP TRANSMISSION LINE ARRAY RF COIL, RF SHIELD CONFIGURATION AND INTEGRATED APPARATUS OF RF COIL AND RADIATION IMAGING DEVICE

CROSS-REFERENCE TO RELATED APPLICATION

The disclosure of U.S. Provisional Patent Application No. 62/649,129 filed on Mar. 28, 2018 and Japanese Patent Application No. 2019-36114 filed on Feb. 28, 2019 including specifications, drawings and claims is incorporated herein by reference in its entirety.

BACKGROUND OF THE INVENTION

1. Field of the Invention

The present invention relates to a microstrip transmission line array RF coil, RF shield configuration and integrated apparatus of RF coil and radiation imaging device.

2. Description of the Related Art

Positron emission tomography (PET) imaging system works on by detecting two opposite gamma rays emitted through positron annihilation. It can detect radioactive tracer concentration located in the region of interest and evaluate the metabolic function. On the other hand, magnetic resonance imaging (MRI) system can provide anatomic, functional as well as spectroscopic imaging with superior soft tissue contrast by detecting the nuclear magnetic resonance (NMR) signal of the atom of interest. The hybrid PET/MRI system can provide detail information of the diagnostic investigation that are not possible with one module alone and thereby, can improve the quality of patient treatment process and therapy monitoring. An insert-type PET for the existing MRI system, similar to the various extremity radiofrequency (RF) coils of the MRI systems, can be an affordable alternative to the commercially available whole-body PET/MRI system that costs more compared to the price of a stand-alone MRI system. But there are technical challenges considering PET insert for MRI systems that affects imaging performances. To avoid mutual electromagnetic (EM) interferences between PET front-end (F/E) detector electronics and the MRI system components, the PET F/E electronics are RF shielded using thin conducting materials, like copper (Cu) or carbon fiber. Implementation of these extra shielding materials inside an already-installed MRI system reduces the MR signal-to-noise ratio (SNR) along with other performance degradations. There are two dominant adverse effects due to these shielding materials.

1. First is the requirement of increment in RF power and the corresponding reduction in SNR and possible increase in specific absorption ratio (SAR).

2. Second is the induction of an eddy currents by MRI gradient field, which distorts the primary gradient fields and introduces image artifacts.

An efficient RF coil compatible to the RF shielded PET detector ring that would induce reduced eddy currents is a basic requirement in these aspects. Moreover, an array of RF coils compatible to the RF shielded PET insert can improve the SNR value that would at the same time make parallel imaging possible for accelerated MR imaging. Implementation of microstrip transmission-line (MTL) concept in the RF coil design is one of the promising design concepts in this aspect, in which the microstrip conductors as the RF coils are usually positioned in parallel with same-length electric-ground conductors constructing RF transmission-lines and in which the ground conductors are usually a single-layer conductor planes that are usually wider than the microstrip conductors. If we consider an array of MTL RF coils for PET insert for MRI, implementation of the RF shield of PET insert as the ground conductor in replacement of usually-implemented single-layer ground planes of MTL coils would reduce the total amount of RF shielding materials which is important for improved SNR with reduced eddy current effects for MR imaging.

Several research groups have studied on different design aspects of the PET insert for the MRI system, with the main concentration on brain PET/MR imaging [1-5]. In all these designs, RF coils were implemented as separate module and mostly inside the RF shielded PET ring—either separately from or integrated with the PET ring. One study [3] implemented MRI built-in body RF coil that resides outside the PET insert. All of these studies were concentrated on existing 3 T (tesla) MRI systems, and used single-channel birdcage RF coil at least as a transmitter. A multi-channel RF coil, like an array of MTL coil, would be particularly suitable for ultrahigh field (UHF) MRI systems, in which case the RF interference of the coil's field within the imaging region (ROI) becomes dominant, as the RF wavelength at UHF becomes comparable to the imaging dimension of interest. As a result, with a single-channel RF coil, the field homogeneity reduced much and dark spots can appear [6] in the images at UHF MRI. By controlling the phase and amplitude of individual coil in an array of RF coils, this effect can be resolved for acceptable imaging performances.

Problems to be Solved

There are two traditions of RF shielding the PET front-end electronics for developing PET insert for the existing MRI systems:

(i) modular shielding—using multiple RF shield cages [1-3] in which each RF shield cage can contain plurality of radiation detectors and their front-end electronics; and, (ii) continuous shielding—using a large continuous RF shield cage [4-5] to shield all the PET detectors in the ring.

In all of these prototype PET insert studies [1-5], loco-regional RF coil (e.g., head coil) were used either separately (inside the PET ring) or integrated in one frame with the loco-regional PET ring (e.g., brain size PET). The PET ring and the RF coil acted as separate modules.

In the case of existing MRI systems, the MR machine is usually optimized during the installation for the best possible imaging performance. As a result, the RF shielding materials required to shield the PET front-end electronics become "unwanted" to the MRI system. It is to mention here that the MRI system operates using different static and low-to-high frequency magnetic fields (e.g., gradient field, RF field) that adversely interferes with any conductive materials inside the MRI bore, and degrades the MR imaging quality. The shielded PET insert significantly reduces the MRI signal-to-noise ratio (SNR) to a greater extent with as minimum as 40% reduction [3] (maximum of about 80% [4]) was seen for normal MR imaging protocols (like, gradient echo imaging). With fast and usually implemented MR imaging protocols, like, echo planar imaging (EPI), or fast spin echo imaging, the SNR reduces further. On the other hand, because of these "unwanted" shielding materials included with the PET insert, the RF power requirements in the transmit RF coil increases compared to that required for the usual MR imaging without the PET insert inside the MRI bore, that might increase the SAR values of the RF coil with PET insert. Because of this shielded PET insert, the RF field homogeneity of the coil reduces as well.

In this invention, the RF shield of a PET insert is used as the electric ground conductor for an array of microstrip conductors to construct an array of multi-channel transmission-line RF coil that is implemented as RF transmitter and/or receiver for hybrid PET, MRI and MR spectroscopy (MRS) studies. Based on the number of RF shield cages used to RF shield all the PET detectors in a full ring or partial ring PET insert configuration, the PET inserts can be classified into two categories: (i) modular PET—uses more than one RF shield cages, and (ii) complete enclosed PET insert—that uses one continuous RF shield cage to shield all the detectors in a PET ring. The RF shield cage in any of the above-mentioned PET insert categories can become a source for inducing large loop of low frequency gradient eddy current (Faraday's law) generated from gradient current switching used in the MR imaging sequences and can hamper MR imaging performances by opposing the fast switching of the gradient current pulses (Lenz's law). Eddy current fields generate signal intensity loss and geometric distortions in the reconstructed images, create noisy sound and mechanical vibrations in the inserted PET module. To reduce gradient eddy current effects, the RF shield can be implemented using multiple layers of RF shields instead of single layer shielding in which different layers are implemented using the same or combination of different types of RF shielding materials, like metal foil or mesh-type metal shield or non-metal conducting materials like carbon-fiber.

Till now, there is no study on human PET insert for ultrahigh magnetic field MRI systems, like, 7 T MRI system. SNR of MR images improves much at UHF because of the large magnetic field strength. However, at UHF the RF wavelength becomes short and comparable to the coil length and to the dimension of the imaging region, and generate stationary wave that make it almost impossible for the single-channel volume RF coil (e.g., birdcage coil) to generate homogeneous RF field with high fill-factor. At UHF, because of constructive and destructive interferences, dark spots emerge in the imaging region [6]. Intensive research works are going on to solve this issue by designing multi-channel RF coil with/without the RF shimming capability [7-11]. In the RF shimming, the phase and amplitude of individual coil in an array of RF coils are controlled to generate homogeneous RE field to the target imaging region.

Most of the research concentration for PET insert study with MRI systems considered RF transmit coil inside the RF shielded PET ring. It is possible to use RF transmit coil outside the PET ring as well and the MRI built-in body RF coil is one of choices, provided the RF shield for PET ring is designed in modular configuration with narrow intermodular gap between RF shielded PET detector modules, wherein the intermodular gap can be possible to implement both in the transaxial and axial direction, in which the latter case (in the axial direction) is sometimes called as 'ring-gap'. However, as the gap between PET detector module should be as small as possible for generating artifact free PET images, few milli-meter gaps are usually maintained in the PET ring designs. It is suggestive to electrically float the RF shield cages of the PET insert from the RF electric ground, that would enable RF transmit field from the transmit RF coil outside the RF shielded modular PET insert to enter to the ROI inside the PET insert through the intermodular gap given in the PET ring. This concept of PET insert is sometimes called as RF penetrable PET insert.

Since the existing MRI system already have patient bed installed with the MRI bore, the space above the bed is the possible region for using PET insert inside the MRI bore. For human body PET, MRI and MRS studies considering for adult or pediatric study with PET insert with an existing MRI system with patient bed, optimized utilization of available open space above the patient bed is required. And, an oval or semi-oval shaped RF penetrable PET insert in the form of full-ring or partial-ring geometry that implements MRI built-in body RF coil as transmitter would be suitable with these considerations—a full ring is defined as a PET ring surrounding the ROI that does not have large detector gap comparable to the dimension of a single detector block and a partial ring is defined as a PET ring that does not have detectors in one or more regions surrounding the ROI. The volume RF coil is dependent on geometric symmetry. A multi-channel array coil as transmitter and/or receiver of the present invention can address all these issues with compact and asymmetric configurations.

On the other hand, magnetic resonance spectroscopy (MRS) study with the interests for imaging of nucleus other than that of proton [12-14], like for the sodium (Na) or phosphorous (P) imaging (also called as other (X)-nucler) along with proton imaging, requires multiple RF coils [15] tunable for multiple nuclear magnetic resonance (NMR) frequencies corresponding to different nucleus. Like the PET imaging, the MRS study also considers molecular imaging and combined PET/MRS study would further provide new findings about the detail of disease progress and can improve treatment process and therapy monitoring as well. The SNR response of X-nuclei is much lower compared to the proton spectroscopy. At UHF, due to large magnetic field strength the X-nuclei study have shown promising SNR performances [13]. This invention considers multi-tuned coils for PET/MRS study as well.

Further, PET shield with a function of RF coil is shown in [16] and, RF coil comprising strip conductor antenna is shown in [17].

REFERENCES

[1] H. P. Schlemmer, B. J. Pichler, M. Schmand M, et al. Simultaneous MR/PET imaging of the human brain: feasibility study, Radiology 248 (2008) 1028-1035.
[2] F. Nishikido, T. Obata, K. Shimizu, et al., Feasibility of a brain-dedicated PET-MRI system using four-layer DOI detectors integrated with an RF head coil, Nucl. Instr. Meth. Phys. Res. A 756 (2014) 6-13.
[3] P. Olcott, E. Kim, K. Hong, et al., Prototype positron emission tomography insert with electro-optical signal transmission for simultaneous operation with MRI, Phys. Med. Biol. 60 (2015) 3459-478.
[4] K. Hong, Y. Choi, J. H. Jung, et al., A prototype MR insertable brain PET using tileable GAPD arrays, Med. Phys. 40 (2013) 1-11.
[5] A. J. Gonzalez, S. Majewski, F. Sánchez, et al., The MINDView brain PET detector, feasibility study based on SiPM arrays, Nucl. Instr. Meth. Phys. Res. A, 818 (2016) 82-90.
[6] C. M. Collins and Z. Wang, Calculation of Radiofrequency Electromagnetic Fields and Their Effects in MRI of Human Subjects, Mag. Reson. Med., 65 (2011) 1470-1482.
[7] X. Zhang, K. Ugurbil, and W. Chen, Microstrip RF Surface Coil Design for Extremely High-Field MRI and Spectroscopy, Mag. Reson. Med., 46 (2001) 443-450.

[8] R. F. Lee, C. J. Hardy, D. K. Sodickson, and P. A. Bottomley, Lumped-Element Planar Strip Array (LPSA) for Parallel MRI, Mag. Reson. Med., 51 (2004) 172-183.

[9] J. T. Vaughan, C. J. Snyder, L. J. DelaBarre, et al., Whole-Body Imaging at 7 T: Preliminary Results, Mag. Reson. Med., 61 (2009) 244-248.

[10] G. Adriany, E. J. Auerbach, C. J. Snyder, et al., A 32-Channel Lattice Transmission Line Array for Parallel Transmit and Receive MRI at 7 Tesla, Mag. Reson. Med., 63 (2010) 1478-1485.

[11] K. L. Moody, N. A. Hollingsworth, F. Zhao. An eight-channel T/R head coil for parallel transmit MRI at 3 T using ultra-low output impedance amplifiers, Journ. Mag. Reson., 246 (2014) 62-68.

[12] A. L. Brownell, B. G. Jenkins, D. R. Elmaleh et al. Combined PET/MRS brain studies show dynamic and long-term physiological changes in a primate model of Parkinson disease. Nat Med 1998; 4:1308-1312.

[13] V. Panebianco, Giove F, Barchetti F et al. High-field PET/MRI and MRS: potential clinical and research applications. Clin Transl Imaging 2013; 1:17-29.

[14] Zhang X, Chen Y E, Lim R et al. Synergistic role of simultaneous PET/MRI-MRS in soft tissue sarcoma metabolism imaging. Magn Reson Imag 2016; 34:276-279.

[15] G. Shajan, G. Mirkes, K. Buckenmaier et al. Three-layered radio frequency coil arrangement for sodium MRI of the human brain at 9.4 Tesla. Mag. Reson. Med., 75 (2016) 906-916.

[16] Japanese Patent laid-open No. 2012-152551

[17] Japanese Patent laid-open No. 2006-280929

Means for Solving the Problem

Three forms of RF shielded PET inserts are considered in this invention. In a first form, as shown in FIG. 6(a) for example, the each RF shield cage of a modular PET insert houses one or more radiation detectors inside each shield cage and is implemented as the RF electric ground for a microstrip transmission line RF coil. And, several of such combined PET-microstrip coils are implemented as an array of RF coils as well as PET insert in the full ring and/or partial ring geometry for hybrid PET, MRI and MRS studies. In the figures, 10 denotes RF shield PET detector module, 12 denotes microstrip conductor.

In a second form as shown in FIG. 6(b) for example, each RF shield cage of modular PET insert houses plurality of radiation detectors and is implemented as the electric ground plane for plurality of microstrip transmission line conductors as multiple RF coils. And, several of such multiples of coils are implemented as an array of RF coil as well as PET insert in the full ring or partial ring geometry for hybrid PET, MRI and MRS studies. In the figures, 30 denotes continuous RF shield cage, 42 denotes PET detector.

In the third form as shown in FIG. 6(c) for example, the all radiation detectors of a PET ring, especially for the case of full-ring geometry, are RF shielded using a single continuous RF shield cage 30. And the whole RF shield cage 30 is implemented as the electric ground for an array of microstrip transmission line conductors 12 as an array of RF coils as well as PET insert in the full ring and/or partial ring geometry for hybrid PET, MRI and MRS studies.

In this invention, the RF shields of PET insert is implemented as the electric ground conductors for an array of microstrip conductors connected to the RF feed line and they both work as RF transmission-line coil. The array of coils is implemented as multi-channel RF transmit and/or receive coil with or without other type of RF coils. The other coils include the single channel volume RF coil or multi-channel other types of RF coil (e.g., loop-type RF coil) in consideration of proton imaging with or without RF coils for X-nuclei study. In any case the other coils can be implemented as transmitter and/or receiver. For the X-nuclei study for PET/MRS study, several coils are combined to tune to different resonance frequencies of interest. Different designs of decoupling circuits using capacitors and/or inductors are used to decouple between coils of an array and between coils for the case of multi-tuned RF coil for PET/MRS X-nuclei study.

In the most simplified format of the proposed coil, one PET shield cage and one microstrip conductor are arranged parallelly, and multiple shunt capacitors in between the two conductors are used that acts both for the reduction of the axial length (also called electric length:wire length expressed by delay time of signal, not by physical length) of the coil to match to the dimension of the imaging region of interest and for tuning the coil to the resonance frequency of interest. It is also possible to implement the mentioned coil without shunt capacitors but axial length of the coil would increase that might not match the actual imaging dimension of interest. The combined coil need not have to be straight along the length of the coil and it can be bended as well. The shunt capacitors should be combination of trimmer-type and ceramic type capacitors whose values are calculated based on the theory of microstrip transmission line available in the literature. Since the existing calculation approaches were proposed considering a single layer ground plane, some design parameters, like the capacitance between the microstrip conductors and the ground PET shield, are slightly different for the case of the proposed coil that can be handled with variable trimmer tuning and matching capacitors. A dielectric material can be used in between the two conductors, which is not preferable for PET study to avoid attenuation of gamma photons by the dielectric materials. The lengths of ground shield and microstrip conductor need not have to be the same, although the length of the ground plane is preferable to be equal or larger than that of the microstrip conductor. In its convention, the width of the ground shield is larger than the width of the microstrip conductor. Moreover, portion of the PET insert RF shield cage that faces the microstrip conductor can be curved and can have extension of RF shields in the radial direction and/or in the axial direction. The thickness of the microstrip conductor and the RF ground shield cage need not have to be the same and thickness of the microstrip conductor should be preferably larger than the three skin depths of the corresponding resonance frequency. The microstrip conductor should be metal conductor, like copper foil. The material for ground shield need not have to be the same as that of the microstrip conductor.

This invention Mainly concentrates on to develop PET insert in combination of RF coils for medium (e.g., 3 Tesla) to ultrahigh field (e.g., 7 Tesla) MRI systems, though theoretically it is possible for lower magnetic field strength MRI as well. This proposed combined PET-microstrip coil system will make it easier to develop PET system for the hybrid UHF PET, MRI and MRS studies, like, for the 7 Tesla, 9.4 Tesla and so on. For up to 3 T MRI systems, an alternative design, if required, including a single channel volume transmit coil (like, the birdcage coil) and multi-channel proposed receiver coil is considered as well. It is to mention here that a single channel loco-regional birdcage coil as transmitter for 3 T MRI system generates acceptable high RF field homogeneity and fill factor required for the practical MR imaging purposes. For UHF MR study, a combination of multi-channel degenerate birdcage coil with the proposed PET-microstrip coil is also possible.

In the case of RF penetrable PET insert that implements RF transmit coil outside the PET ring (e.g., MRI built-in body RF coil), the RF shield cages of a PET insert (with individually shielded modular PET detectors) is suggestive to maintain electric floating from the MRI RF ground for RF penetration with less attenuation. Implementing RF coil as receiver outside the PET insert degrades the SNR of MR images severely as the reception sensitivity is become very low compared to using receiver RF coil inside the RF shielded PET insert. A separate receiver array coil inside the PET ring is recommended for such design for acceptable MR imaging performances. A properly detuned coil of the present invention as RF receiver will provide the required electrical floating of the RF shield of the PET insert during RF transmit from RF coil positioned outside the PET insert.

To develop body-size PET insert for adult or pediatric body imaging with the already installed MRI systems, non-cylindrical PET insert with oval or semi-oval crosssection is needed. An oval or semi-oval shape is needed to use the maximum available space on top of the patient bed of the existing MRI systems. Even for brain imaging, oval shape matches well with the shape of human head. In terms of PET, this would increase the sensitivity because of the close proximity of the PET detectors near the imaging region. Conventional transmit volume coils are dependent on geometric symmetry and will not be suitable for such asymmetric shape of PET insert. Moreover, considering body PET insert, the space inside the MRI bore is limited and the PET insert should be as compact as possible. The proposed combined system will resolve these aspects as well, as the PET module and RF coil are a compact and combined single module. By implementing RF shimming for an array of RF coil of the present invention, homogeneous RF field generation is possible even for the asymmetric geometry of the combined PET-array coil system.

In the case of RF shield cage for the PET detector ring, large loops of gradient eddy current induce in the RF shield cage that oppose the primary applied gradient fields and make faster MR imaging very much difficult by preventing the fast-switching of gradient currents. Shield designs suitable for PET insert that will induce reduced eddy current and at the same time maintain the RF electric continuity are mentioned in this invention considering the proposed combined system.

The amplitude of eddy current increases with the increase in the thickness of the RF shields and a thin (e.g., one or two skin depths of the corresponding RF frequency) RF shield is preferable in this regard. A mesh type metal RF shields, like copper mesh, is also preferable for reduced eddy currents. Moreover, to avoid generation of large eddy current loops in the RF shields of the PET insert, the RF shield can be divided into segmented small dimensional sections. An implementation of longitudinal and/or lateral (in the transaxial direction) narrow slots (e.g., of 1 or 2 mm) screen printed in the RF shields would block generation of large gradient eddy current loops. For efficient RF shielding, the RF current induced in the shield should maintain electric continuity throughout the shield. For this purpose, electric coupling preferably using ceramic capacitors that shorts the RF currents between segmented shields and functions as open-circuit for the low frequency gradient eddy currents is used in the slotted regions between segments of shield. Non-metal shields, like the carbon-fiber shield, can be an alternative option to the metal shields, as they function as insulator at low frequency and become conducting in the RF frequency of interest for MR imaging. RF shield for PET detector modules can be of single layer shield of any of the above-mentioned types. It can be of multi-layered as well, preferably two-layer shield. In such case, in one design, one layer can be thin (e.g., 1 mm) and continuous metal conducting foil (e.g., copper) and the other layer can be of segmented type or mesh type or non-metal type shield and the thickness of each type of shield need not have to be the same. In another design, one layer can be of segmented metal foil type and the other layer can be of mesh type or non-metal type shield and the thickness of both layers need not have to be the same. In another design, one layer can be of non-metal type shield and the other layer is a mesh type metal conductor. In another design, both layers can be of segmented type or mesh type metal conductors or non-metal RF shields, in which the thickness or the density of mesh can be different for different layers. In another design, portion of the RF shield cage for PET detector modules, preferably portion of the shield that faces the RF transmit coil (e.g., the inner peripheral surface of the shield cage in the cage of transmit coil inside the PET ring) can be of multi-layered type shield of any of the type mentioned above and the other portion can be of one-layer shield of any of the type mentioned above. In the case of multilayer shields, all layers need not have to be connected to the RF ground of the MRI system. The PET data readout and power cables are needed to be RF shielded as well. The junction between the RF shield cage of PET detector module and the cable RF shield can be, but not necessarily, connected by decoupling circuits, and in the case of multiple shield layers of the RF shield cage of PET detector module, all layers of the RF shield need not have to be connected to the RF shield of the cable.

According to a first aspect of the present invention, a microstrip transmission line array radio frequency (RF) coil for a radiation imaging device used in a bore of a magnetic resonance imaging (MRI) system is provided. The RF coil comprises plurality of microstrip transmission line functions as RF antenna for the MRI system, plurality of radiation imaging detectors disposed along the transmission line and detect gamma ray from a center of the bore, an RF shield covering the radiation imaging detectors, and shunt capacitors connecting the RF shield and the transmission lines, wherein the transmission lines are disposed on a central bore side face of the radiation imaging detector, and the RF shield functions as a shield of the radiation imaging detectors and ground conductor of the microstrip transmission lines.

According to a second aspect of the present invention, a microstrip transmission line array RF coil as defined in the first aspect of the present invention is provided, wherein the RF shield has a modular construction for covering at least one radiation imaging detector separately using multiple RF shield cages.

According to a third aspect of the present invention, a microstrip transmission line array RF coil as defined in the first aspect of the present invention is provided, wherein the RF shield has an integrated construction for covering a plurality of the radiation imaging detectors together.

According to a fourth aspect of the present invention, a microstrip transmission line array RF coil as defined in any one of the first to the third aspect of the present invention is provided, wherein a plurality of the RF shield and/or the microstrip transmission line are insulated by a decoupling circuit.

According to a fifth aspect of the present invention, a microstrip transmission line array RF coil as defined in any one of the first to the fourth aspect of the present invention is provided, wherein the RF coil is a bird cage RF coil having a bird cage construction used in combination with the microstrip transmission lines, the bird cage RF coil is a separate coil, the bird cage RF coil is used as an RF transmitter and/or an RF receiver, and the microstrip transmission line array RF coil is used as the RF receiver and/or the RF transmitter.

According to a sixth aspect of the present invention, a microstrip transmission line array RF coil as defined in any one of the first to the fifth aspect of the present invention is provided, wherein harmonic coils with different order are disposed for decoupling and/or magnetic resonance imaging.

According to a seventh aspect of the present invention, a microstrip transmission line RF coil as defined in a second aspect of the present invention is provided, wherein the microstrip transmission line functions as an RF receiving coil, and a separated RF coil and/or a built-in RF coil incorporated in the MRI out of a radiation device functions as an RF transmitting coil.

According to an eighth aspect of the present invention, a microstrip transmission line RF coil combined with an RF shielded radiation detector module is provided, in which the RF shield cage of the radiation detector module is made to be a ground body of the microstrip transmission line RF coil, the RF shielded radiation detector module includes a plurality of radiation detectors with fields of view both along axial direction and cross axial direction, and combined coil extends straight along an axial and/or width direction of the coil or bended.

According to a ninth aspect of the present invention, a micostrip transmission line RF coil as defined in the eight aspect of the present invention is provided, wherein data and power cable of the RF shielded radiation detector module front end electronic circuit within a radiation device combined with the microstrip transmission line RF coil are RF shielded, and the RF shield cage of the radiation detector module and a cable shield are connected directly or connected by way of a decoupling circuit.

According to the tenth aspect of the present invention, a micostrip transmission line RF coil as defined in the ninth aspect of the present invention is provided, wherein the RF shield cage of the radiation detector module within the radiation device combined with the microstrip transmission line RF coil has a slit and/or a hole and/or connector for decreasing low frequency gradient eddy current induced from a gradient field of the MRI system, and/or for cooling the radiation detector front end electronic circuit, and/or for connection data and power cable to the front end electronic circuit of the radiation detector module provided within the RF shield cage of the radiation detector module.

According to the eleventh aspect of the present invention, a micostrip transmission line RF coil as defined in a eight aspect of the present invention is provided, wherein single coil is provided as an array within the microstrip transmission line RF coil combined with the radiation detector according to any one of the first to the seventh aspect of the present invention.

According to the twelfth aspect of the present invention, an RF shield configuration for an RF shield cage of a radiation detector combined with a microstrip transmission line RF coil is provided, comprising, a single layer of RF shield formed by continuous and/or segmented metal material, and/or mesh like conductive material, and/or nonmetallic conductive material.

According to the thirteenth aspect of the present invention, an RF shield configuration for an RF shield cage of a radiation detector combined with a microstrip transmission line RF coil is provided, comprising, a plurality of layers of RF shield formed by continuous and/or segmented metal material, and/or mesh like conductive material, and/or nonmetallic conductive material.

According to the fourteenth aspect of the present invention, an RF shield configuration for an RF shield cage of a radiation detector combined with a microstrip transmission line RF coil is provided, comprising, a plurality of layers of RF shield provided for a part of the RF shield cage of the radiation detector, and a single layer of RF shield is provided for remaining part of the shield cage.

According to the fifteenth aspect of the present invention, a RF shield configuration as defined in the thirteenth and fourteenth aspect of the present invention is provided, wherein different layer of the plurality of layers of the RF shield have the same type RF shield material and the same shield design.

According to the sixteenth aspect of the present invention, a RF shield configuration as defined in the thirteenth or fourteenth aspect of the present invention is provided, wherein the plurality of layers of the RF shield have different type RF shield material and different shield design, According to the seventeenth aspect of the present invention, a RF shield configuration as defined in any one of the twelfth to thirteenth aspect of the present invention is provided, wherein, any layer or all layers have segmented shield design with small gap between segments, and the segment has a coupling circuit that would short an RF current to maintain RF continuity for shielding purpose, and act as open circuit for low frequency gradient eddy currents.

According to the eighteenth aspect of the present invention, an integrated apparatus of RF coil and radiation imaging insert is provided, comprising, the microstrip transmission line array RF coil according to any one of the first to eleventh aspect of the invention, and/or the RF shield configuration according to any one of the twelfth to seventeenth aspect of the invention.

By the present invention, RF shield for PET detector is functioning as the ground conductor plane of the RF coil. Therefore, compact and multipurpose system can be obtained with reduced amount of shielding materials that would induce less eddy current and consume comparatively less RF power.

Increased electro-mechanical control over the whole multimodal system by making them single compact system.

RF signal reception capability can be multichanneled and SNR for the magnetic resonance study is increased.

Implementing parallel imaging for accelerated MR imaging that would reduce the MR imaging duration during patient investigation.

Implementing RF shimming for RF field localization, especially needed for ultrahigh field MRI. This option allows us to develop PET insert and coil with asymmetric geometry.

Enabling the new concept of PET-coil module for RF penetrable type PET inserts.

BRIEF DESCRIPTION OF THE DRAWINGS

The preferred embodiments will be described with reference to the drawings, wherein like elements have been denoted throughout the figures with like reference numerals, and wherein.

DETAILED DESCRIPTION OF THE PREFERRED EMBODIMENTS

Hereinafter, with reference to the drawings, a detailed description is given of embodiments of the invention. Note that, the present invention is not limited to descriptions of the below embodiments and practical examples. Components of the embodiments and the practical examples described below contain what is easily assumed by those skilled in the art, what is substantially the same, and what is in a so-called equivalent scope. Moreover, the components disclosed in the embodiments and the practical examples described below may be appropriately combined with each other or appropriately selectively used.

Figure 1:
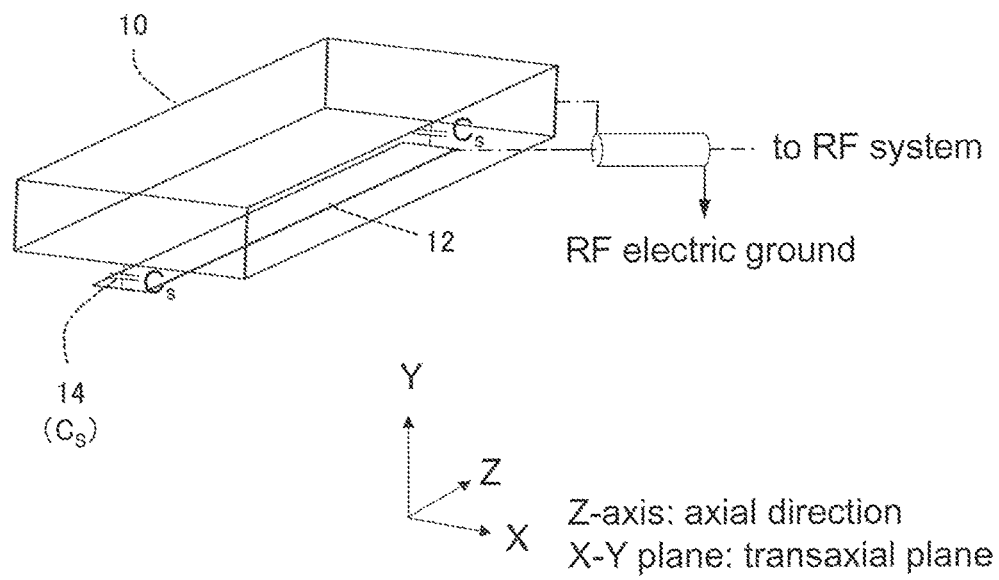
FIG. 1 is a schematic view of a strip transmission line coil in which the radio frequency (RF) shielded PET module is used as the ground plane of the coil.
Figure 2:
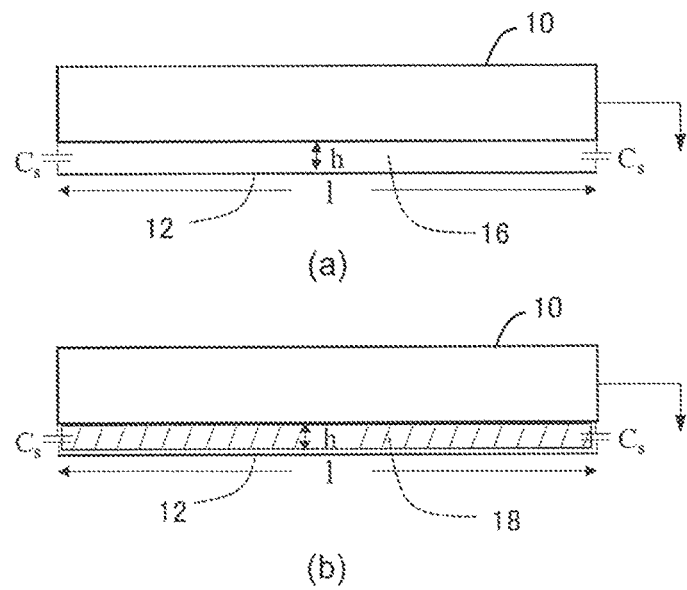
FIG. 2 are side (axial) views of strip transmission line coils with RF shielded PET module as the ground plane in which the coil with two shunt capacitors at the two ends of the coil represent the first harmonic coil.
Figure 3:
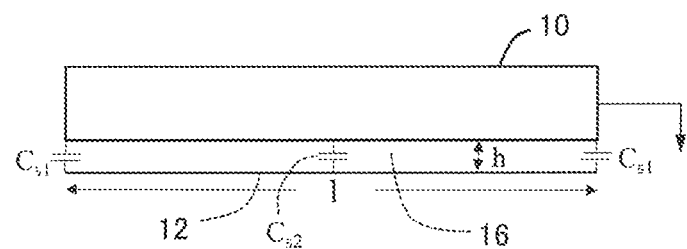
FIG. 3 are side (axial) views of strip transmission line coils with RF shielded PET module as the ground plane in which the coil represent the second harmonic coil with three shunt capacitors—two at the two ends of the strip conductor and one at the center—represent the second harmonic coil.
Figure 3:
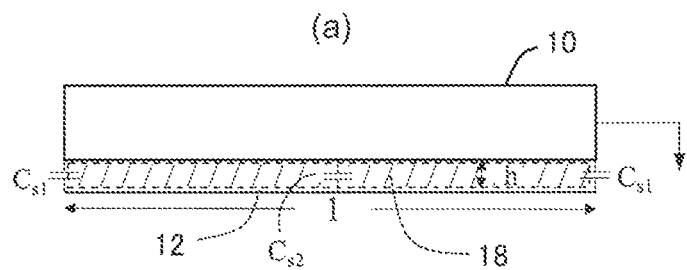
Figure 4:
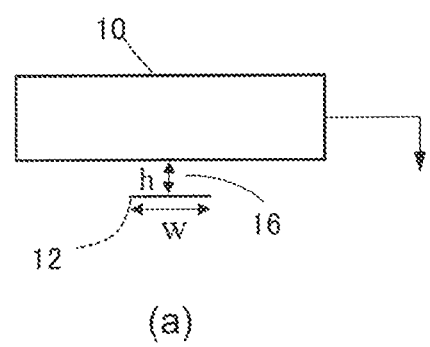
FIG. 4 are front (transaxial) views of the strip transmission line coils with RF shielded PET module as the ground plane.
Figure 4:
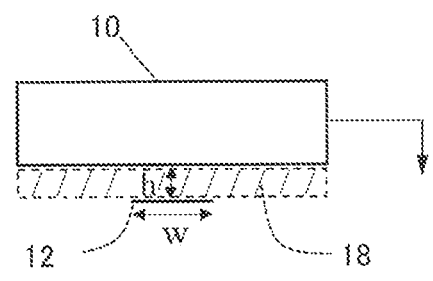
Figure 4:
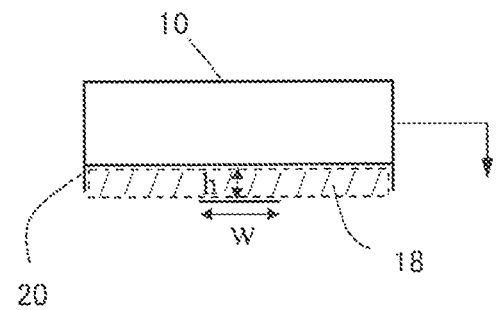

Considering the RF shielded PET insert, two types of shield designs can be implemented. In one design, a complete ring of PET detectors is shielded by multiple separate RF shield cages with narrow gaps in between the separate shield cages—usually 8 or, 12 or, 16 such RF shielded PET modules are arranged in the transaxial directions in a and/or multiple ring format. In the other design, these all PET detectors in the ring are placed inside a continuous RF shield cage. For both cases, the shielded PET is connected (grounded) to the MRI RF ground for shielding purpose. On the other hand, a microstrip transmission line RF coil is comprised of a microstrip conductor and a ground conductor plane with a calculated gap in between. The ground plane act as a shield or reflector for the field created by the microstrip conductor. The geometric length (the electrical length of which is either $\pi$ or $2\pi$) of the microstrip conductor should be integer multiples of quarter wavelength ($\lambda/4$). For the resonance frequency of interest for MRI system, the length of the coil become larger than the imaging dimension of interest. Discrete shunt capacitors with/without dielectric materials is used to match the required length of the coil (e.g., 25 cm) to integer multiples of $\lambda/4$. In this invention, the shielded PET ring—either in separately shielded modular multiple detector format or continuous RF shield cage format—is used as the ground plane for the array of microstrip coils. So, the shielding materials of the PET insert will become an integral part of the RF coil (e.g., FIGS. 1, 6, and 7) and the combined system can be tuned and matched to maximize the RF efficiency. The gap between the microstrip conductor 12 and the RF shielded PET detector module 10 can have nothing but air (air gap 16) (FIGS. 2(a), 3(a) and 4(a)). The gap between the microstrip line 12 and the RF shielded PET detector module 10 can also have dielectric materials 18 with low-loss tangent property, preferably PTFE (FIGS. 2(b), 3(b) and 4(b)).

Figure 5:
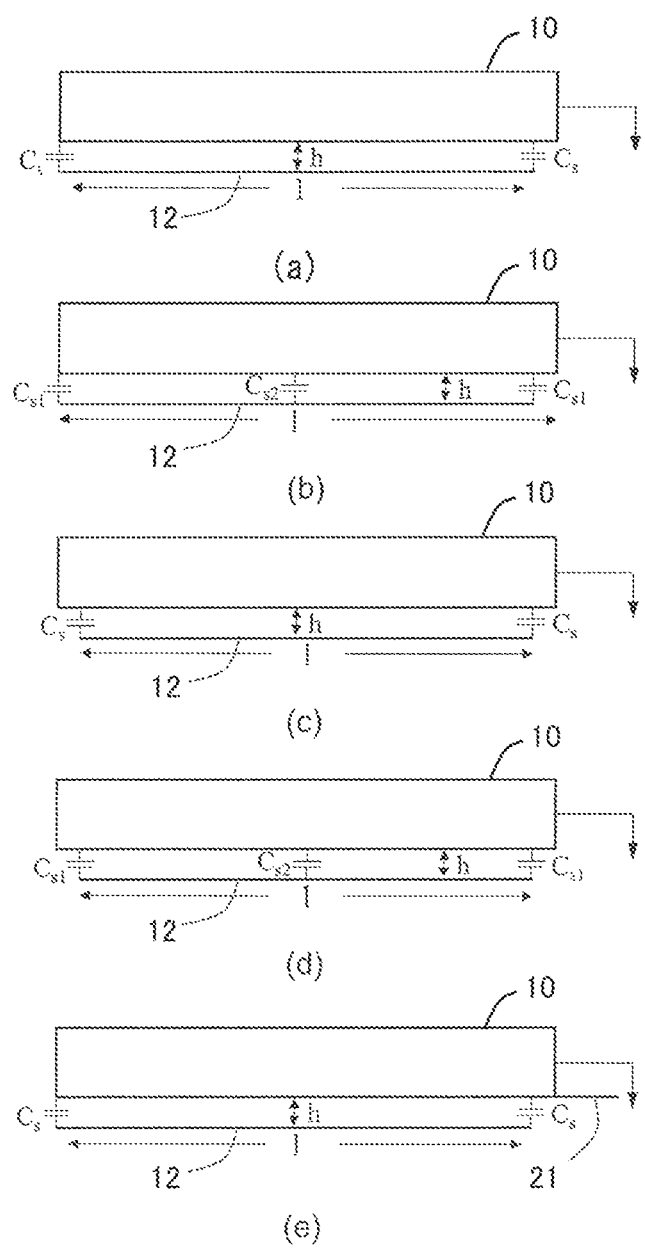
FIG. 5 are side (axial) views of strip transmission line coils with RF shielded PET module as the ground plane in which the strip conductors are shorter than the axial length of the RF shielded PET modules.

In consideration of PET imaging, the gap should preferably be air-filled only (air gap 16) to avoid gamma photon attenuation that might occur if a dielectric is used in the gap. The shield of the grounded PET detector shield cages can be extended (extended shield 20) (e.g., FIG. 4(c)) in the radial direction in between two microstrip conductors for better confinement of the RF field to the imaging region and to give certain decoupling between coils. The length of the microstrip conductor can be, but not necessarily, equal to the length of the shielded PET detector module 10. The strip conductor 12 can be shortened near the end of the RF shielded PET detector modules 10 (FIGS. 5(a)-(b)) where the PET detector data and power cables enter inside the shield box, to reduce the effect of RF interference between coil and PET data and power cables. The microstrip conductor can be shortened from both end of the RF shielded PET detector modules (FIGS. 5(c)-(d)). It can also be possible to use extended RF shield 21 in the lower plane (e.g., the shielded plane facing the microstrip conductor) of the RF shield cage near the end of the RF shielded PET detector modules (e.g., FIG. 5(e)) where the PET detector data and power cables enter inside the shield box and/or near the other end. On the other hand, the data cables and power cables connected to the PET front-end readout electronics mounted inside the RF shield cage are also RF shielded to avoid RF interference between PET and MRI. The cable shielding is usually connected with the RF shield cage of the RF shielded PET module. For the purpose for proper coil function, the cable shield can be decoupled from the RF shield cage of the PET detector module and this can be done by using decoupling circuits, preferably by using capacitor and/or inductor and/or filter in between the RF shield cage of the PET detector module and the RF shield of the cables.

Figure 6:
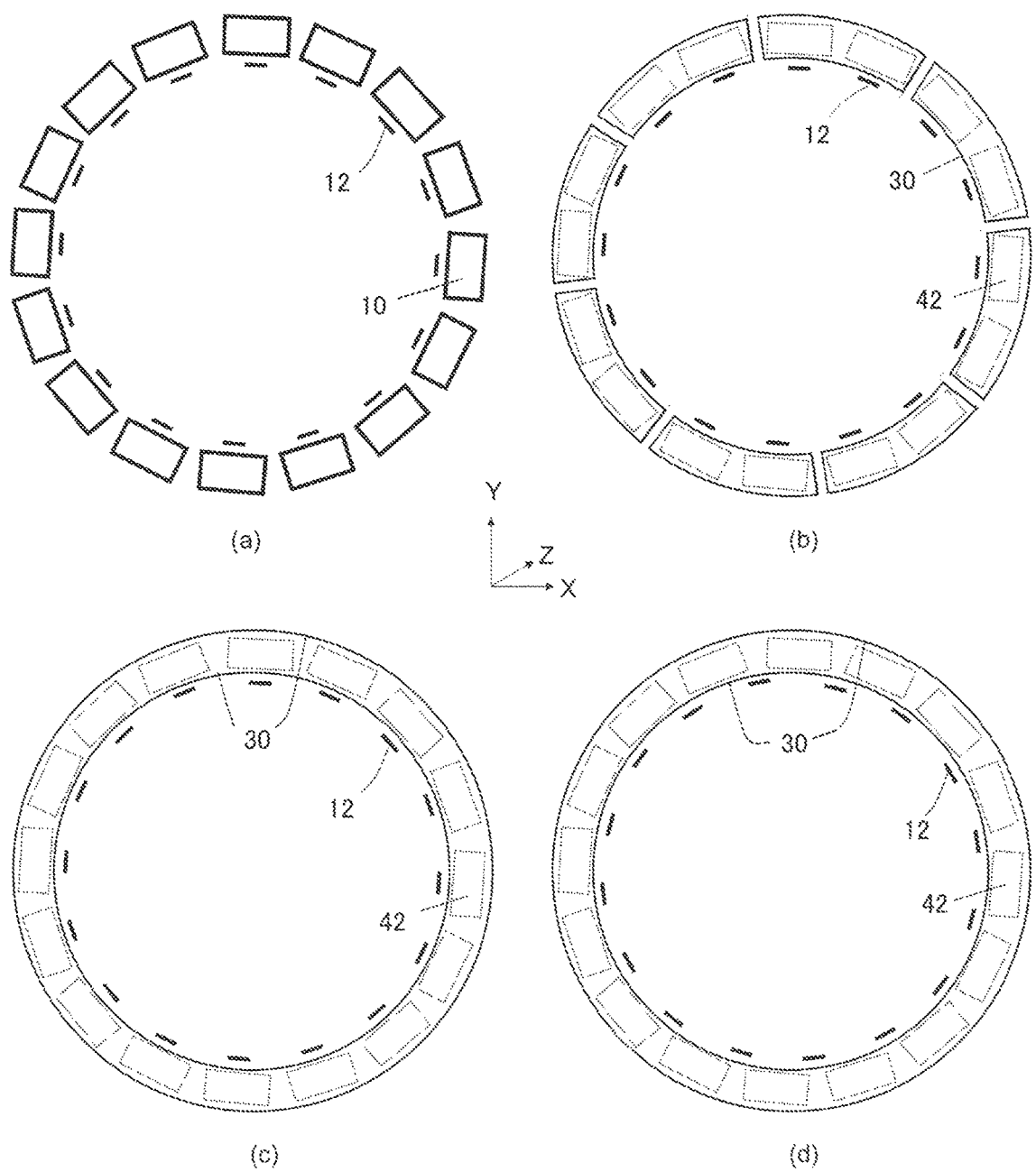
FIG. 6 are schematic views of the combined RF array coil and PET modality with separately shielded PET detector modules (a)-(b), and continuous shield cage for all detectors (c)-(d)

Also, the width of the microstrip line can be smaller (preferably, three or more times) than the width of the RF shield cage of the PET detector module and, the microstrip conductor 12 is aligned along the length of the shielded PET detector module 10 (along the axial length of the imaging region of the MRI system), in the case of separate multiple RF shielded PET detector modules 10 (FIG. 6(a)-(b)), and positioned facing the imaging region. In the case of separately shielded modular PET ring configuration, single or multiple micro strip coils can be used with each separate RF shield cages that might include multiple PET detectors positioned both along the axial and transaxial directions of the PET ring. In the case of continuously shielded PET ring that includes microstrip conductors 12 with one large RF shield 30, the position of individual microstrip conductors 12 should not necessarily be considering the center of individual PET detectors 42, as illustrated in the FIGS. 6(c)-(d). Also, in the case of continuously shielded PET ring, the shield can have slits to avoid developing large eddy currents (e.g., FIG. 13) in which case slits 50 should be capacitively coupled for the continuity of the RF currents and at the same time to block developing large MRI gradient coils generated eddy current loops in the shield 30. The thickness of the microstrip conductor 12, preferably copper, should be much smaller, in principle, than the width of the microstrip conductor 12, and is about several times thicker (e.g., about six times) than the skin depth of the corresponding resonance radio frequency of the magnetic resonance imaging system (e.g., skin depth of copper at 100 MHz is 0.0066 mm), and the thickness of the shielding materials in the shielded PET detector module 10 can be smaller than the thickness of the microstrip conductor 12 and also can have opening slits and/or holes and/or some sort of shielding discontinuities in the shield cage to avoid developing large loop of eddy current generated from the low frequency switching gradient magnetic field used for magnetic resonance imaging purposes and for cooling purposes, and, also can have RF shielded opening for PET data and power cables to be connected to the front-end PET detector electronics inside the RF shield box. The shielding materials of the PET detector module 10 can also be such that to poses the property of insulator at the low frequency range to avoid induction of switching gradient eddy currents and, conductive in the required radio frequency ranges for shielding purposes, preferably carbon fiber, and/or the shielding cage of the PET detector module 10 can be a combination of purely conductive materials, preferably copper, that faces the microstrip conductor 12 and the other parts of the shield cage can be of carbon fiber or such kind of materials. The dimensions of the microstrip line 10, dimensions of the gap 16, 18 filled with air in between them and/or with the dielectric material, and the values of shunt capacitors 14 among are, other design parameters, subject to the tuning of the microstrip coil to the required resonance radio frequency of the magnetic resonance imaging system. 4 or 8 or more such individual strip coils will make an array of multichannel RF coil (FIGS. 6, 7, 8, 9, 10, 11, and 12). The array of coils can be used both as transmitter and receiver. Because of multiple receive coils the SNR will increase compared to single channel volume coils. Parallel transmission and reception are possible with this multichannel array coil. Through parallel imaging it will be possible to accelerate imaging process and shorten imaging time. By controlling the phase and magnitude of the RF signal at each channel, the multichannel coil will provide RF shimming capability for highly homogeneous RF field localization at a particular imaging region of interest, like, brain tumor, heart, lung tumor, prostate cancer, and so on.

In the case of separately shielded multiple PET detector modules 10 in the PET ring, it is recommended to use separately RF shielded PET detector modules 10 very close to each other to avoid parallax error generated in the PET reconstructed image because of wider gap in between the PET detector blocks. In such case, the combined detector-coil elements become very close to each other through the grounded RF shield cages of the PET detectors (e.g., 3 mm or less gap in between shielded PET detector modules 10), while the gap between nearest neighbor strip conductors 12 remain reasonably wide. As decoupling the nearest coil elements is necessary at least for efficient use of RF power to generate required RF field in the imaging region, one option is to implement decoupling circuitry preferably by using capacitor 22 (e.g., FIG. 8) and/or inductor in between the strip conductors and/or in between the grounded shield boxes. Moreover, implementing different harmonics of microstrip transmission line coils side-by-side can also provide required decoupling even without the use of decoupling capacitors 22. Implementing different harmonic coils can enable multiple RF frequency resonances which can be implemented for MR spectroscopic study of multiple nuclei as well. The microstrip transmission line RF coil with shunt capacitors (Cs) 14 between the microstrip conductor and RF shielded PET detector module 10 at two ends of the microstrip conductor 12 is the first harmonic coil $h_1$ (FIG. 2 and FIG. 8(b)). Implementing three shunt capacitors $C_{s1}, C_{s2}$ in between the microstrip conductor and RF shielded PET detector module 10 makes it second (FIG. 3) order harmonic coil $h_2$—(FIG. 3 and FIG. 8(b)). Based on requirement, higher order harmonics of the microstrip transmission lines can also be implemented.

Figure 7:
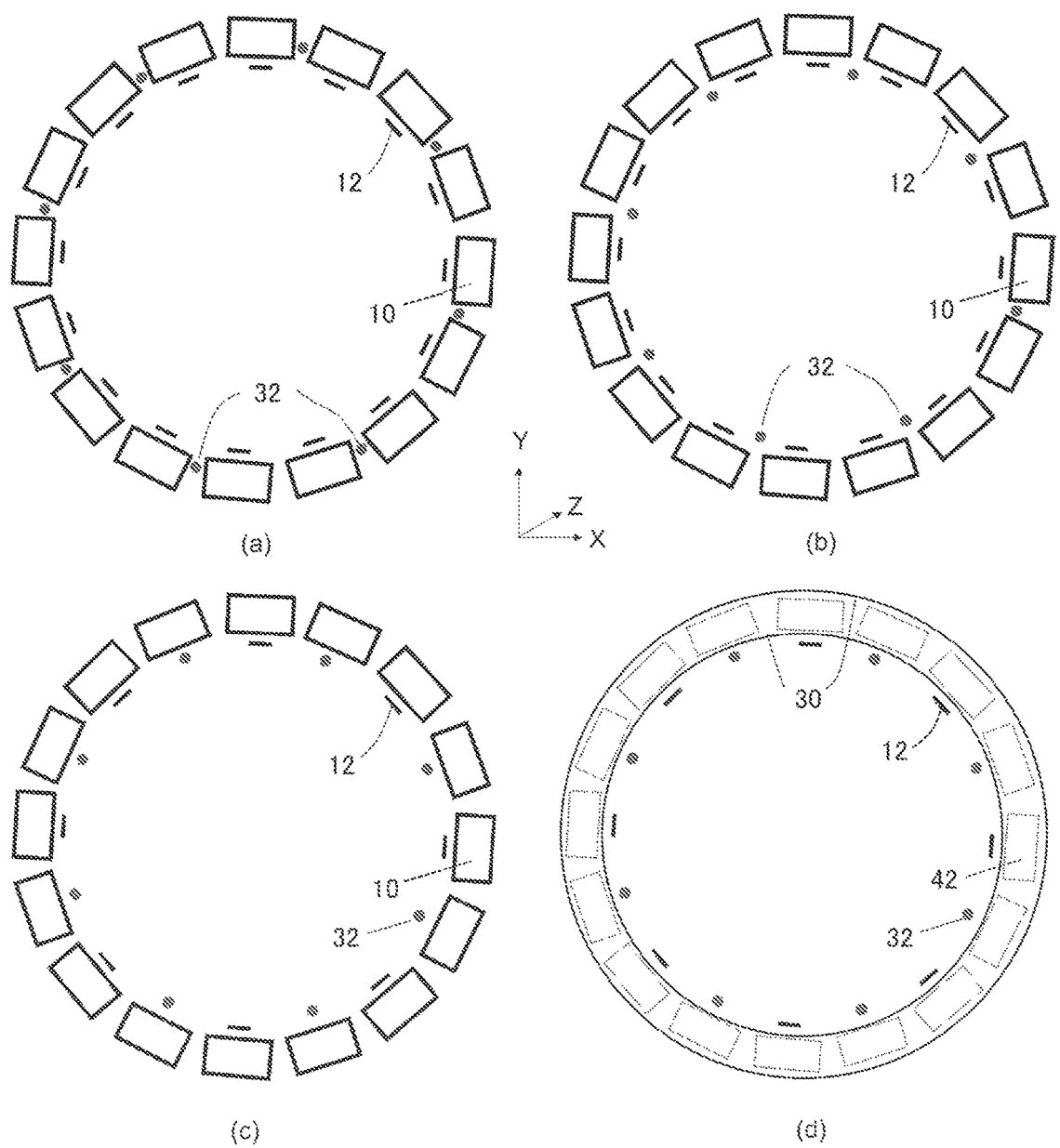
FIG. 7 are schematic views of the combined RF coil and PET system in which a birdcage RF coil is implemented either in between RF shielded PET detector modules or in between strip conductors or side-by-side with the strip coils for both individual PET detector shield cage and continuous shield cage cases.
Figure 8:
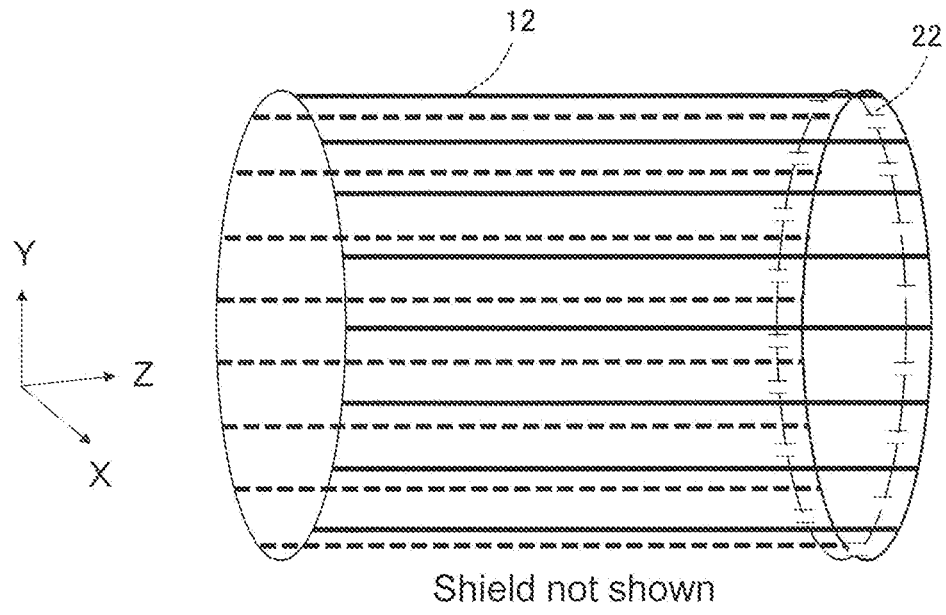
FIG. 8 are example diagrams of capacitive decoupling of array of microstrip coils (a) and decoupling using different harmonic coils the array (b) in which different harmonic coils can be implemented for multiple RF frequency resonance for MR spectroscopic study.
Figure 8:
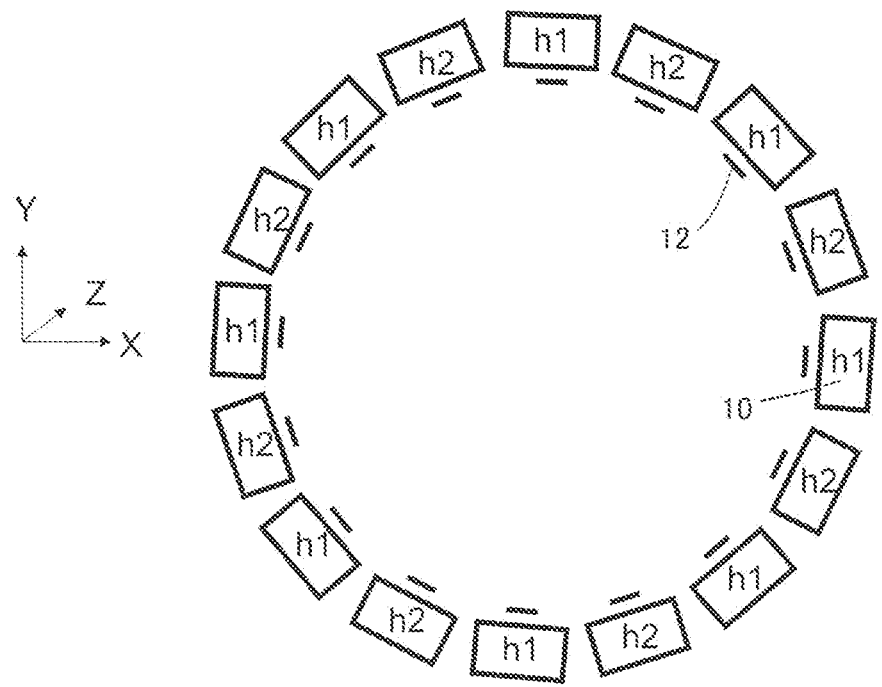

The proposed approach is highly suitable for ultrahigh magnetic field MRI systems. RF wavelength at 7 or high Tesla magnetic field becomes comparable to the coil and/or patient dimensions and, generates constructive and destructive interferences resulting in dark spots in the imaging region. Because of this, RF field becomes highly inhomogeneous for the volume coil at ultrahigh field MRI. By controlling the phase and amplitude of individual coil in the array of coils it is possible to generate homogeneous RF field in the imaging region. An alternative design is also possible that may be better at 3 Tesla or lower magnetic field MRI systems, if required, including birdcage coil as transmitter (birdcage coil performs well as RF transmitter at low field MRI systems) and/or as receiver, and the array coil only as receiver as illustrated in FIG. 7. Three different design configurations in case of separately shielded PET detectors are given in FIGS. 7(a)-(c). In FIGS. 7 (a) and (b), the birdcage coil elements 32 are positioned in between shielded PET modules or in between microstrip conductors, in which the strip conductors can be used only as RF. In another design of separately shielded PET detectors, the birdcage coil elements can be arranged azimuthally in alternate positions (e.g., in between every one or two or more microstrip coils) inside the shielded PET ring (FIG. 7(c)) with reduced number of microstrip coils. Similar implementations like in FIGS. 7(b) and (c) are possible to implement for continuous shield cage, one example is given in FIG. 7(d). In the case of continuous shield cage configuration of FIG. 7(d), the positon of individual microstrip conductors 12 should not necessarily be considering the center of PET detectors 42, as illustrated in the FIGS. 6(b)-(c).

Figure 9:
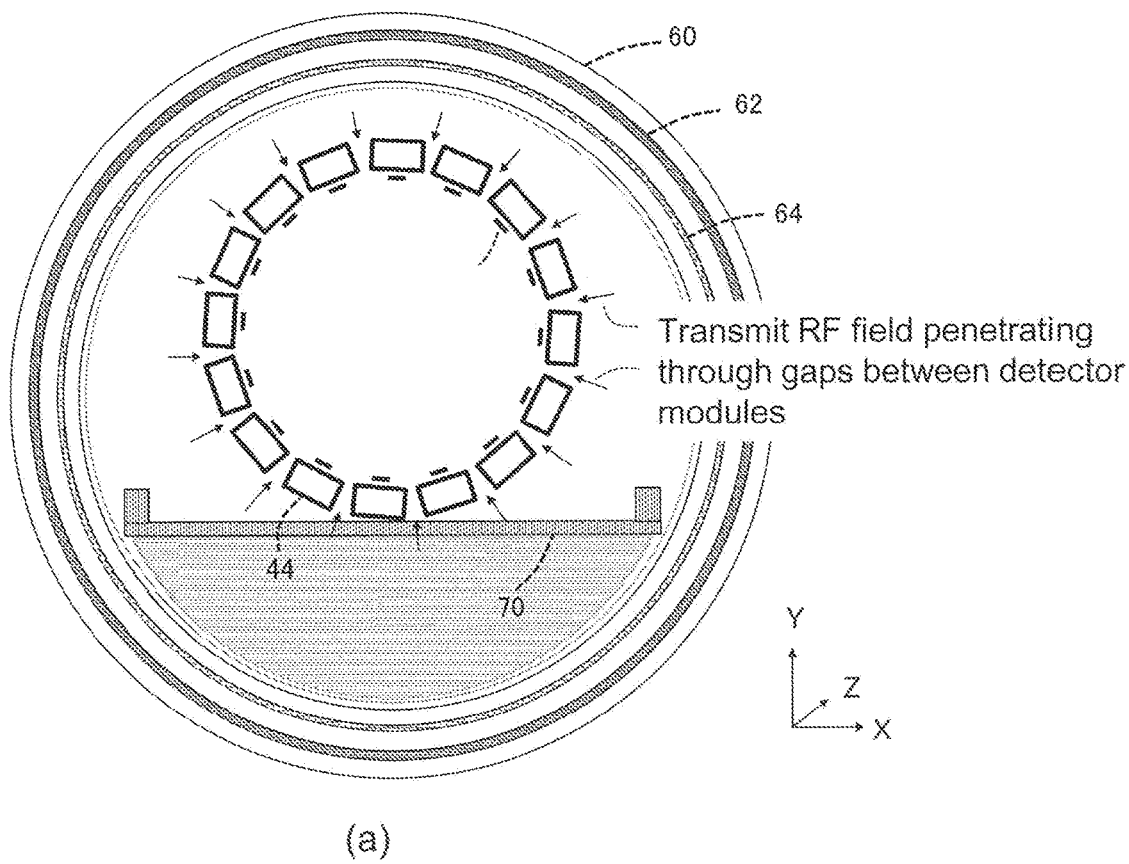
FIG. 9 show RF penetrable PET insert in which the MRI system built-in body RF coil is used as RF transmitter and the said microstrip coil with PET detectors is used as RF signal transmit and/or receiver, wherein the receiver-only coil is usually connected to a detuning circuit that would provide the electrical floating during RF field transmission from the build-in RF coil.
Figure 9:
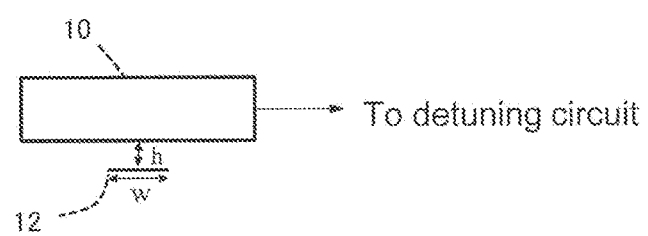
Figure 10:
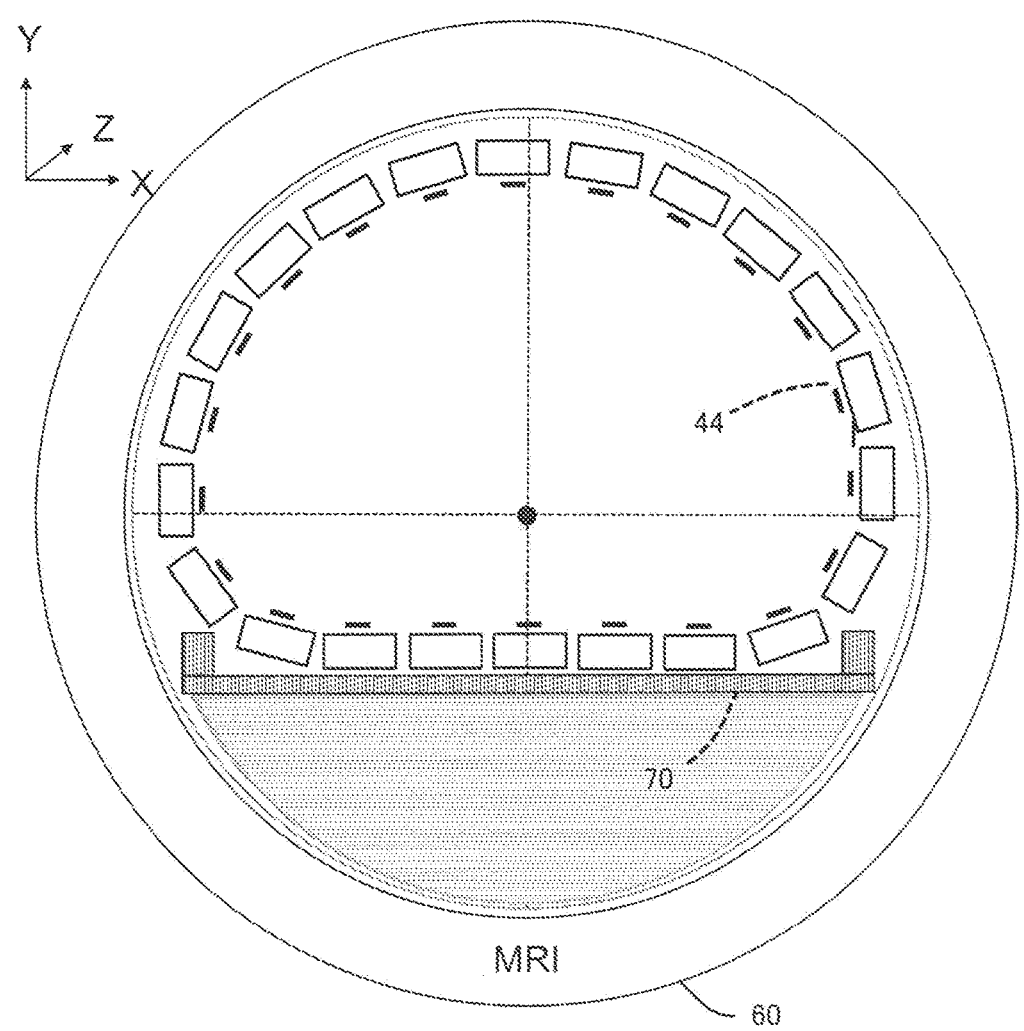
FIG. 10 is an illustration of semi-oval orientation of PET-coil combination modules to use the maximum space above the patient bed of the already installed MRI systems.
Figure 11:
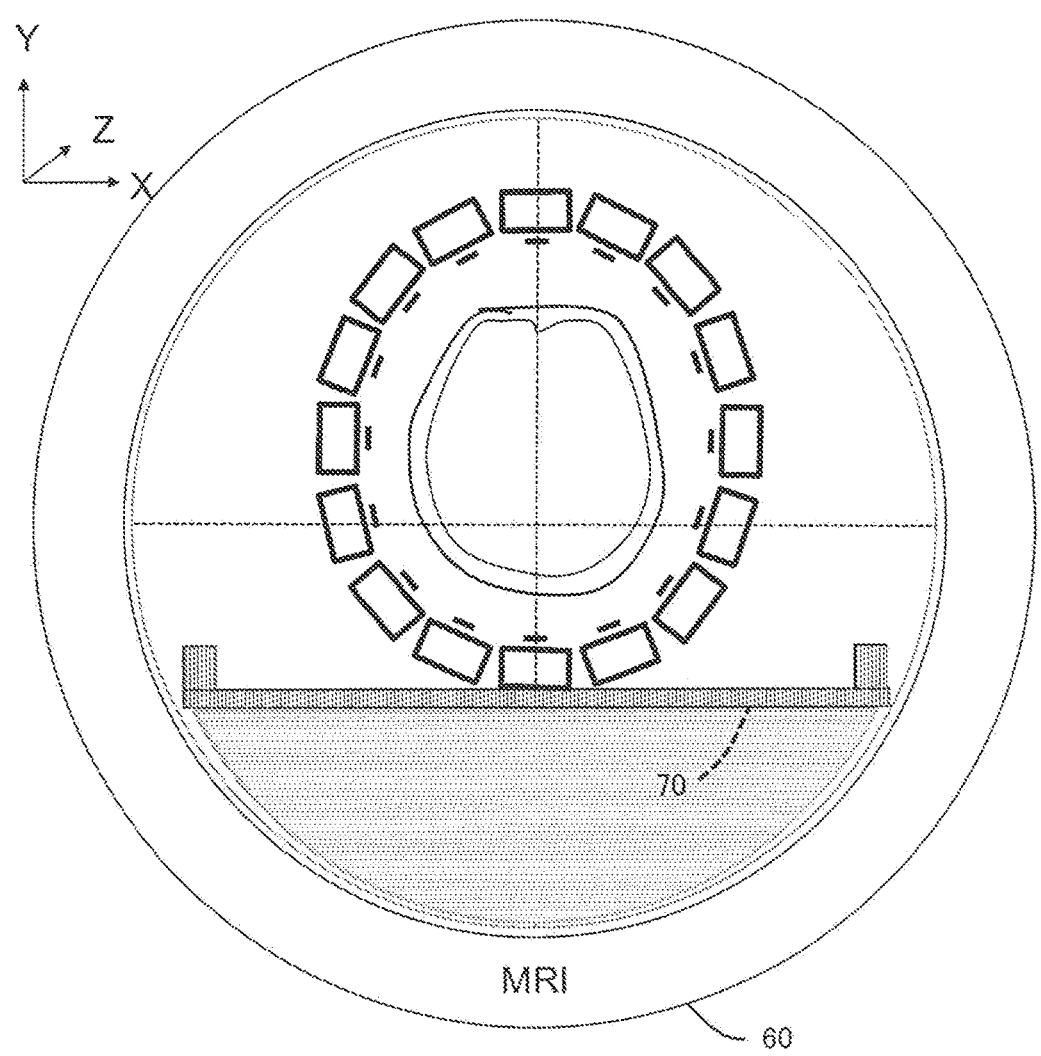
FIG. 11 is an illustration of semi-oval orientation of combined PET-coil modules considering the brain imaging with already installed MRI systems.

In the case of RF penetrable PET insert, the MRI built-in body RF coil is used as transmitter. Instead of the built-in body RF coil, a separate RF coil outside the PET insert can be implemented as well for floating concept. The separately RF shielded PET detector modules are used in the ring format with narrow inter-module gap for the RF field to pass through to the imaging region. The transmit RF field from the body RF coil (from outside the PET ring) passes through the inter-module gaps with some attenuation (FIG. 9(a)) if the shielded PET modules are kept electrically floating from the MRI ground, otherwise (e.g., if the shields are grounded) the transmit RF field might get highly attenuated. In FIG. 9, 44 denotes PET detector with strip coil, 60 denotes MRI system, 62 denotes gradient coil assembly, 64 denotes built-in body RF coil as transmitter, 70 denotes patient bed.

In the case of RF penetrable PET insert, the microstrip RF coil in this invention can be used only as RF receiver. As was mentioned, the microstrip RF coil needed a ground plane as a basic component for its operation and, in this invention the shielded PET modules acts as ground plane. Usually the RF receiver always contains detuning circuits that would provide the coil in this invention the required electrical floating during RF field transmission from the body RF coil. But the data cables and power cables connected to the PET front-end readout electronics that are mounted inside the shield box are also RF shielded. The cable shielding is usually connected with the RF shield cage of the RF shielded PET module. For the purpose for further electric floating of the RF shield cage, the cable shielding should be decoupled from the RF shield cage of the PET detector module and this can be done by using some sort of decoupling circuitry, preferably by using capacitor and/or inductor and/or filter in between the RF shield cage of the PET detector module and the RF shield of the cables.

Figure 12:
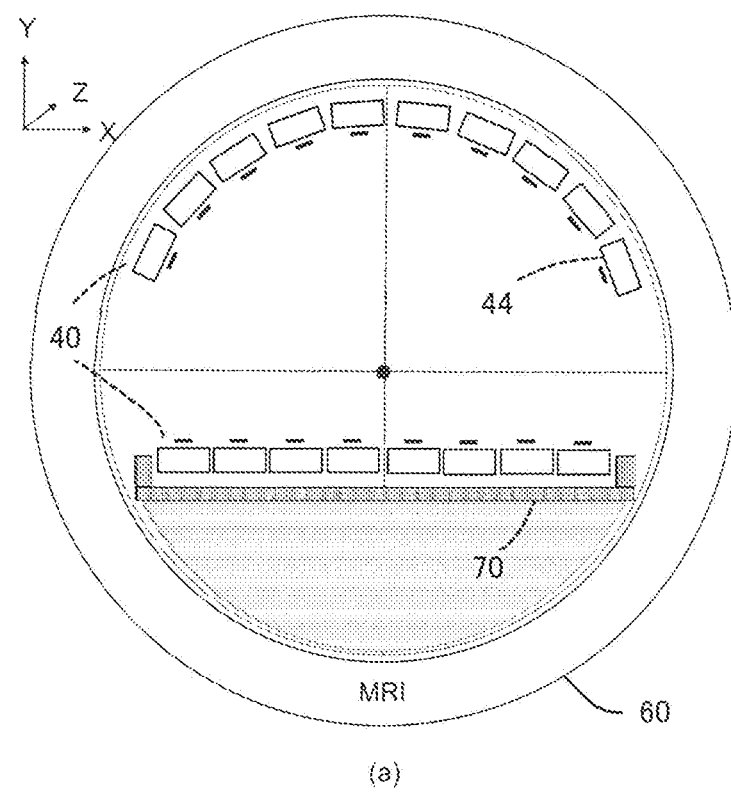
FIG. 12 is an illustration of partial-ring PET geometries with microstrip transmission array coils.
Figure 12:
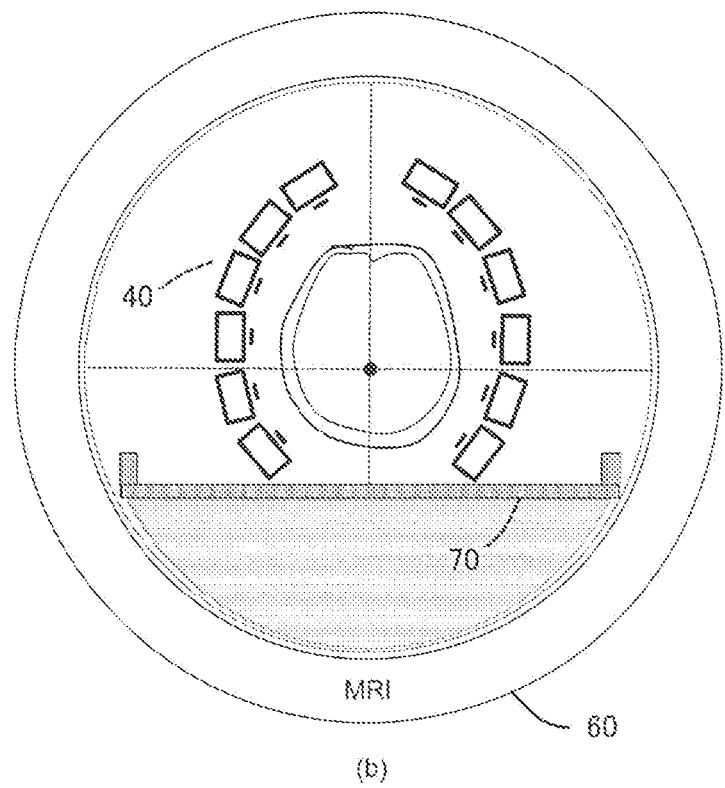

The conventional birdcage type or transverse electromagnetic field (TEM) type volume coils require geometrical symmetry. By implementing multichannel array coil of the present invention with RF shimming functionality, a homogeneous transmit RF field is possible to achieve even for the asymmetric PET ring geometry. Usually, the PET inserts are considered for the existing MRI systems that includes patient bed 70. In terms of body shape PET insert, asymmetric PET ring geometry, like, semi-oval shape (FIG. 10), is a suitable choice of interest to use the maximum space above the patient bed 70. Even for brain imaging, a semi oval shape geometry (FIG. 11) is more compact that would improve both the PET and MRI sensitivity. Partial-ring PET 40 geometries can also be possible with microstrip transmission line array coils with or without separate RF transmit coil (like, birdcage RF coil), as shown in FIG. 12. This concept in this invention will also make this combined system into one compact module that would take relatively less space in terms of instrumentation. Concept of "electrically floating PET insert" can also be implemented in asymmetric geometry.

Figure 13:
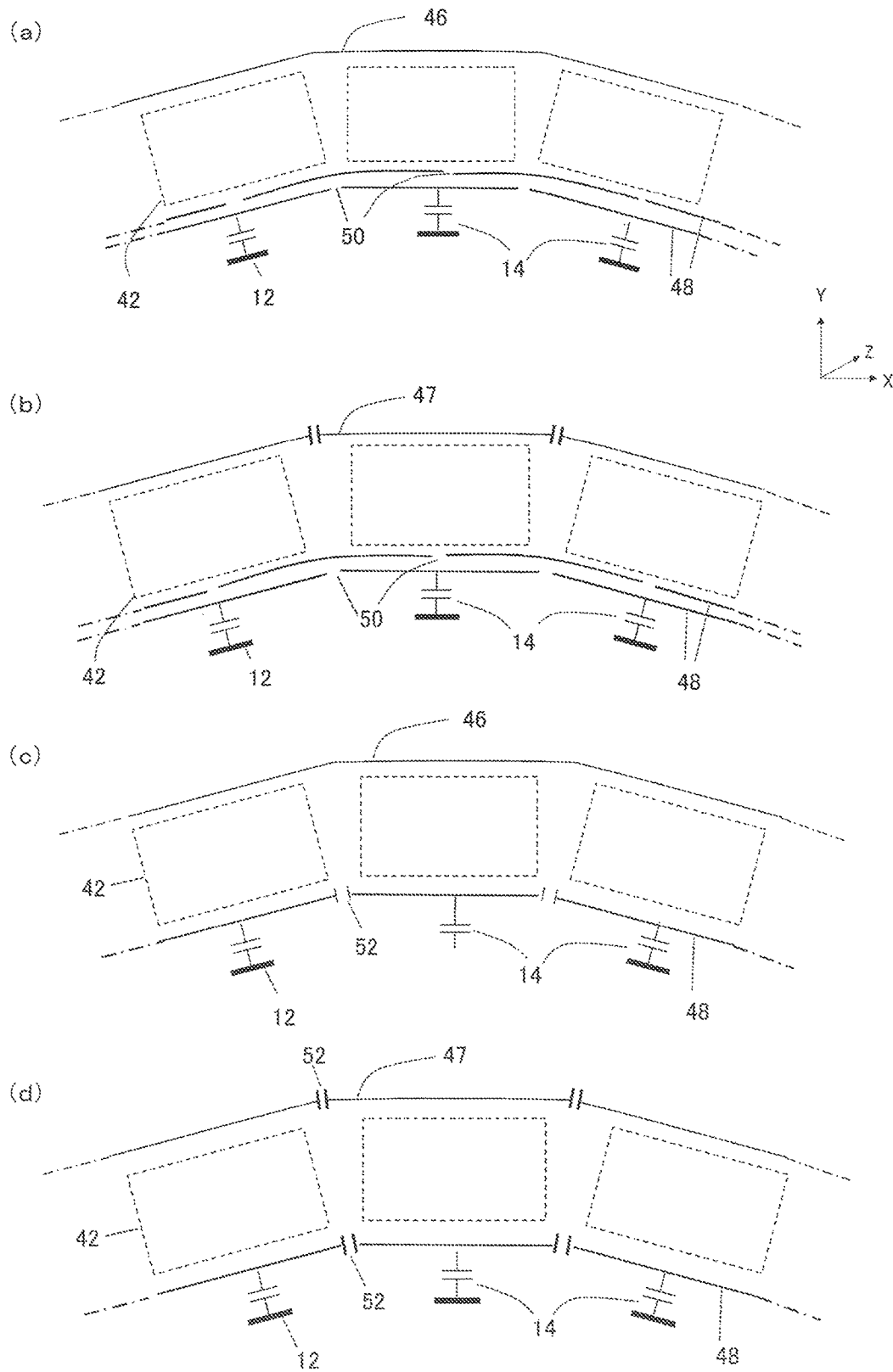
FIG. 13 shows different shielding designs for the case of continuous RF shielded PET ring to reduce the induction of low frequency gradient eddy current.

In the case of large RF shield of PET insert that can include multiple of microstrip conductors, several example-shield designs (but not limited to these) are illustrated in FIG. 13. In one design (FIG. 13(a)-(b)), the shielding layer at the inner periphery of the PET ring can be designed by using two slotted conductive layers (slotted shield 48) of metallic foils with small gap in between the two layers to avoid generation of large loop eddy currents and at the same time providing enough RF shielding of the PET detectors. These two slotted layers 48 will be oriented to alternate the positions of the slits 50. As the microstrip conductors 12 are close to the inner diameter shielding layer of the PET ring, this shielding layer will be the main concern to reduce RF interference to the PET detectors 42. In the outer diameter part of the PET ring, a continuous shielding 46 can be used either with a very thin metallic foil (e.g., about one skin depth) to avoid large eddy current loops or, using shielding materials that acts as insulator (like, carbon fiber) for low frequency eddy currents generated from the gradient fields of the MRI system. Or the outer peripheral surface can be capacitively-coupled segmented (not continuous) type shield 47 (FIG. 13(b)). The outer peripheral surface can also be designed using multilayer shields similar to the inner surface. In another design (FIG. 13(c)), the shielding layer in the inner diameter part of the PET ring can be of single layer with the slits connected by capacitors 52 that would act as short in the required radio frequency and at same time block the low frequency eddy currents so that it cannot develop large eddy current loops in the shields. Or, both the inner and outer diameter layers of the shield can be slotted with the slits connected by capacitors 52 (FIG. 13(d)).

According to another first aspect of the present invention, a microstrip transmission line array RF coil in which the RF shield of a PET insert dedicated for hybrid PET and magnetic resonance imaging and spectroscopic studies, wherein the PET insert is either in modular RF shield cage configuration or in completely-enclosed RF shield cage configuration or in a combination of both modular and completely-enclosed RF shield cage configurations, wherein the RF shield cage contains at least one radiation detector inside the shield cage, is implemented as the electric ground conductor for an array of microstrip conductors that combinedly functions both as a PET ring for radiation studies and as an array of microstrip transmission line RF coils for magnetic resonance imaging and spectroscopic studies, wherein the electric isolation between coil elements is done by using decoupling circuits in between grounded RF shield cages of PET insert and/or in between microstrip conductors.

According to another second aspect of the present invention, combination of a birdcage RF coil and an array of the said microstrip transmission line coils as defined in the first aspect of the present invention, wherein the birdcage coil is used as RF transmitter and/or receiver, and the array of microstrip coils is used as RF receiver and/or transmitter.

According to another third aspect of the present invention, a microstrip transmission line array coil, as defined in the first and second aspect of the present invention, wherein different orders of harmonic coils are implemented side-by-side for decoupling and/or magnetic resonance spectroscopic study purposes.

According to another fourth aspect of the present invention, in the another first and another second aspect of the present invention, the modularly RF-shielded PET detectors with microstrip conductors that functions both as a PET for radiation studies and as an array of microstrip transmission line RF coils for magnetic resonance imaging and spectroscopic studies are implemented as an array of RF receiver coils for RF penetrable PET insert that implements separate RF coils outside the PET insert and/or the MRI built-in body RF coil as transmitter.

According to another fifth aspect of the present invention, the another first, another second, another third and another fourth aspects of the invention is applicable for both magnetic resonance imaging and/or magnetic resonance spectroscopic studies in combination with PET study, and a combination of multi-tuned RF coils that includes the another first, another second, another third and another fourth aspects of the invention for one or more nuclear magnetic resonance studies and other types of RF coils, preferably loop or dipole or birdcage type RF coils, for one or more nuclear magnetic resonance studies is implemented for the purpose of multimodal PET, MRI and MRS study.

According to another sixth aspect of the present invention, a microstrip transmission line RF coil combined with RF shielded PET detector module in which the RF shield cage of the PET detector module is implemented as the ground plane of the said microstrip transmission line coil and the shielded PET detector module can have plurality of PET detectors both along the axial and transaxial field of view, and the combined coil need not have to be straight along the length of the coil and it can be bending type as well.

According to another seventh aspect of the present invention, the data and power cables of the front-end electronics of the RF shielded PET detector module in the said PET insert combining microstrip transmission line RF coil for hybrid PET, MRI and MRS studies are RF shielded and the junction between the RF shield cage of PET detector module and the cable shield is connected, but not necessarily, by decoupling circuits.

According to another eighth aspect of the present invention, the RF shielded cage of the PET detector module in the said PET insert combining microstrip transmission line RF coil for hybrid PET, MRI and MRS studies can have slits and/or holes and/or connectors for multiple purposes including for the reduction of low frequency gradient eddy current effects induced from the gradient field of the MRI system, for the purpose of cooling of the PET detector front-end electronics, for the purpose of data and power cable connections to the front-end electronics of the PET detector modules mounted inside the RF shield cage of the PET detector module, and so on.

According to another ninth aspect of the present invention, in the sixth invention, single coil is provided in the array of microstrip transmission line coils as in the another first, another second, another third, another fourth, and another fifth aspects of the inventions.

According to another tenth aspect of the present invention, the RF shield cage of the PET detector module of the said PET insert combining microstrip transmission line RF coil has single layer of RF shield wherein the shield is a continuous and/or segmented metal conducting material. The single layer shield can also be made using mesh type conducting materials or non-metal conducting materials, like carbon-fiber.

According to another eleventh aspect of the present invention, the RF shield cage of the PET detector module of the said PET insert combining microstrip transmission line RF coil has multilayer shields, preferably two-layer shields, wherein different layers can have the same shield design with the same type of shield material.

According to another twelfth aspect of the present invention, in the another eleventh aspect of the invention, the multilayer RF shield can have different layers implemented with different shield design with different types of shield materials.

According to another thirteenth aspect of the present invention, in the another eleventh and another twelfth aspects of the invention, the shield in any layer or in all layers can be of segmented type with narrow gap in between the segments and the segments can be, but not necessarily, coupled with preferably ceramic capacitors that would short the RF current and act as open-circuit for the low frequency gradient eddy currents.

According to another fourteenth aspect of the present invention, portion of the RF shield cage of the PET detector module can have multiple layers of shields based on the another eleventh, another twelfth and another thirteenth aspects of the invention and the rest of the shield cage can have single layer of shield based on the another eleventh aspect of the present invention.

In the above description, PET insert for MRI system is mainly described. However, application of the present invention is not limited to the PET insert for MRI system, but can be applied to PET insert for MRS system, SPECT insert for MRI or MPS systems and so on.

INDUSTRIAL APPLICABILITY

PET or SPECT insert for MRI or MRS system for preclinical and clinical imaging and spect-r oscopy can be provided.

What is claimed is:

1. An RF shield configuration for an RF shield cage of a radiation detector combined with a microstrip transmission line RF coil comprising:
   a plurality of layers of RF shield provided for a part of the RF shield cage of the radiation detector; and
   a single layer of RF shield is provided for remaining part of the shield cage.

2. A microstrip transmission line array radio frequency (RF) coil for a radiation imaging device used in a bore of a magnetic resonance imaging (MRI) system, comprising:
   a plurality of radiation imaging detectors each detecting gamma radiation from a center of the bore;
   a plurality of microstrip transmission lines that function as an RF antenna for the MRI system, the transmission lines each being disposed on a central bore side face of one of the radiation imaging detectors;
   an RF shield covering the radiation imaging detectors, the RF shield functioning as a shield of the radiation imaging detectors and ground conductor of the microstrip transmission lines, the RF shield having a modular construction for covering at least one radiation imaging detector separately using multiple RF shield cages; and
   shunt capacitors connecting the RF shield and the transmission lines.

3. The microstrip transmission line array RF coil according to claim 2, wherein the RF coil is a bird cage RF coil having a bird cage construction used in combination with the microstrip transmission lines,
   the bird cage RF coil is a separate coil,
   the bird cage RF coil is used as an RF transmitter and/or an RF receiver, and
   the microstrip transmission line array RF coil is used as the RF receiver and/or the RF transmitter.

4. The microstrip transmission line RF coil according to claim 2, wherein the microstrip transmission lines function as an RF receiving coil, and
   a separated RF coil and/or a built-in RF coil incorporated in the MRI out of a radiation device functions as an RF transmitting coil.

5. An integrated apparatus of RF coil and radiation imaging insert comprising:
   the microstrip transmission line array RF coil according to claim 2.

6. A microstrip transmission line array radio frequency (RF) coil for a radiation imaging device used in a bore of a magnetic resonance imaging (MRI) system, comprising:
   a plurality of radiation imaging detectors each detecting gamma radiation from a center of the bore;

a plurality of microstrip transmission lines that function as an RF antenna for the MRI system, the transmission lines each being disposed on a central bore side face of one of the radiation imaging detectors;

an RF shield covering the radiation imaging detectors, the RF shield functioning as a shield of the radiation imaging detectors and ground conductor of the microstrip transmission lines;

shunt capacitors connecting the RF shield and the transmission lines; and a decoupling circuit that insulates a plurality of the microstrip transmission lines or insulates the RF shield from another RF shield.

7. A microstrip transmission line array radio frequency (RF) coil for a radiation imaging device used in a bore of a magnetic resonance imaging (MRI) system, comprising:

a plurality of radiation imaging detectors each detecting gamma radiation from a center of the bore;

a plurality of microstrip transmission lines that function as an RF antenna for the MRI system, the transmission lines each being disposed on a central bore side face of one of the radiation imaging detectors;

an RF shield covering the radiation imaging detectors, the RF shield functioning as a shield of the radiation imaging detectors and ground conductor of the microstrip transmission lines;

shunt capacitors connecting the RF shield and the transmission lines; and harmonic coils with different orders disposed for decoupling and/or magnetic resonance imaging.

8. An apparatus comprising:
a microstrip transmission line RF coil; and
an RF shielded radiation detector module including:
an RF shield cage that is made to be a ground body of the micro strip transmission line RF coil; and
a plurality of radiation detectors with fields of view both along an axial direction and a cross axial direction of the RF coil,
the apparatus extends straight along the axial direction and/or a width direction of the coil or is bent.

9. The apparatus according to claim 8, wherein a data and power cable of a RF shielded radiation detector module front end electronic circuit within a radiation device combined with the microstrip transmission line RF coil are RF shielded, and
the RF shield cage of the radiation detector module and a cable shield are connected directly or connected by way of a decoupling circuit.

10. The apparatus according to claim 9, wherein the RF shield cage of the radiation detector module within the radiation device combined with the microstrip transmission line RF coil has a slit and/or a hole and/or connector for decreasing low frequency gradient eddy current induced from a gradient field of a magnetic resonance imaging (MRI) system, and/or for cooling the radiation detector front end electronic circuit, and/or for connection data and power cable to the front end electronic circuit of the radiation detector module provided within the RF shield cage of the radiation detector module.

11. The apparatus according to claim 8, wherein a single coil is provided as an array within the apparatus.

12. An RF shield configuration for an RF shield cage of a radiation detector combined with a microstrip transmission line RF coil comprising:

a plurality of layers of RF shield formed by continuous and/or segmented metal material, and/or mesh like conductive material, and/or nonmetallic conductive material, the plurality of layers of the RF shield having different RF shield material type and different shield design.

13. The RF shield configuration according to claim 12, wherein different layers of the plurality of layers of the RF shield have the same type RF shield material and the same shield design.

14. The RF shield configuration according to claim 12, wherein
any layer or all layers have segmented shield design with small gap between segments, and
the segment has a coupling circuit that would short an RF current to maintain RF continuity for shielding purpose, and acts as open circuit for low frequency gradient eddy currents.

15. An integrated apparatus of RF coil and radiation imaging insert comprising:
the RF shield configuration according to claim 12.

* * * * *